US005858607A

United States Patent [19]

Burberry et al.

[11] Patent Number: 5,858,607

[45] Date of Patent: Jan. 12, 1999

[54] LASER-INDUCED MATERIAL TRANSFER DIGITAL LITHOGRAPHIC PRINTING PLATES

[75] Inventors: Mitchell S. Burberry; Sharon W. Weber, both of Webster, N.Y.

[73] Assignee: Kodak Polychrome Graphics, Norwalk, Conn.

[21] Appl. No.: 752,994

[22] Filed: Nov. 21, 1996

[51] Int. Cl.[6] .............................. G03F 7/34; G03F 7/039

[52] U.S. Cl. ....................... 430/201; 430/200; 430/270.1; 430/271.1; 430/964

[58] Field of Search .................................... 430/201, 964, 430/270.1, 271.1, 200; 428/500, 522, 483

[56] References Cited

U.S. PATENT DOCUMENTS

| | | | |
|---|---|---|---|
| 3,410,711 | 11/1968 | Hoge | 117/36.1 |
| 3,506,779 | 4/1970 | Brown et al. | 173/6.6 |
| 3,739,088 | 6/1973 | Landsman | 178/6.6 TP |
| 3,852,091 | 12/1974 | Newman | 117/36.1 |
| 3,945,318 | 3/1976 | Landsman | 101/467 |
| 3,962,513 | 6/1976 | Eames | 428/323 |
| 3,964,389 | 6/1976 | Peterson | 101/467 |
| 4,030,762 | 6/1977 | Peterson | 101/467 |
| 4,034,183 | 7/1977 | Uhlig | 219/122 |
| 4,054,094 | 10/1977 | Caddell et al. | 101/467 |
| 4,063,949 | 12/1977 | Uhlig et al. | 96/27 |
| 4,081,572 | 3/1978 | Pacansky | 427/53 |
| 4,347,785 | 9/1982 | Chase et al. | 101/1 |
| 4,588,674 | 5/1986 | Stewart | 430/201 |
| 4,600,628 | 7/1986 | Nshii et al. | 428/216 |
| 4,626,493 | 12/1986 | Butters et al. | 430/201 |
| 4,693,958 | 9/1987 | Schwartz et al. | 430/302 |
| 5,244,770 | 9/1993 | DeBoer et al. | 430/200 |
| 5,256,506 | 10/1993 | Ellis et al. | 430/201 |
| 5,339,737 | 8/1994 | Lewis et al. | 101/454 |
| 5,351,617 | 10/1994 | Williams et al. | 101/467 |
| 5,459,016 | 10/1995 | Debe et al. | 430/201 |
| 5,468,591 | 11/1995 | Pearce et al. | 430/201 |
| 5,576,144 | 11/1996 | Pearce et al. | 430/201 |
| 5,605,780 | 2/1997 | Burberry et al. | 430/278.1 |
| 5,607,810 | 3/1997 | Verburgh et al. | 430/201 |
| 5,633,119 | 5/1997 | Burberry et al. | 430/201 |
| 5,698,366 | 12/1977 | Tutt et al. | 430/201 |

FOREIGN PATENT DOCUMENTS

| | | |
|---|---|---|
| 0160395 | 11/1985 | European Pat. Off. . |
| 0599689 | 6/1994 | European Pat. Off. . |
| 8402494 | 7/1984 | WIPO . |
| 9425282 | 11/1994 | WIPO . |

*Primary Examiner*—Richard L. Schilling
*Attorney, Agent, or Firm*—Ratner & Prestia

[57] ABSTRACT

An assemblage for forming a lithographic printing plate is disclosed. The assemblage contains a receiver support with a rough hydrophilic surface; a layer containing a poly (cyanoacrylate) binder; and a donor support. When the assemblage is exposed with a high intensity laser beam, the binder is transferred to the hydrophilic surface of the receiver support to produce a lithographic printing plate. The transfer requires relatively low exposure and no post processing is necessary.

25 Claims, 1 Drawing Sheet

LASER-INDUCED MATERIAL TRANSFER DIGITAL LITHOGRAPHIC PRINTING PLATES

FIELD OF THE INVENTION

This invention relates to material-transfer lithographic printing plates, to methods for their production and to the direct writing of digital image information thereon.

BACKGROUND OF THE INVENTION

Lithographic printing plates for offset printing have traditionally been produced using analog optical methods. These methods are time consuming, require wet processing and careful process control. Dry methods have been disclosed such as in U.S. Pat. No. 4,081,572 where a hydrophilic polymer layer is converted to a hydrophobic polymer imagewise. This method requires high energy photons such as those emitted by xenon flash lamps or relatively expensive gas lasers or doubled YAG lasers. It is not well suited for use with relatively inexpensive near IR diode lasers. There are examples, such as in U.S. Pat. No. 4,693,958, utilizing a single layer of polymer and absorber material where laser exposure chemically converts the polymer nature from hydrophilic to hydrophobic. In U.S. Pat. No. 4,034,183 a similar method is disclosed where a hydrophilic layer containing pigments is rendered hydrophobic when exposed to laser radiation and is used on a lithographic press without further processing. This process, however is relatively insensitive and impractical, requiring about 1 to 2 watts of laser power while exposing only 10 cm/sec. There are also photosensitive methods described that require traditional chemical processing as in U.S. Pat. Nos. 3,506,779; 4,020,762; 4,063,949.

Ablative methods have been disclosed where the top layer is etched from a plate to form relief patterns such as in U.S. Pat. Nos. 4,054,094 and 4,347,785. These methods require expensive extremely high power lasers. In other cases, as in U.S. Pat. No. 4,054,094, a hydrophilic surface is ablated to reveal an oleophilic underlayer. A similar approach was taken in U.S. Pat. Nos. 5,339,737 and 5,351,617 where a top coat is ablated and then wiped to expose an underlayer. These processes require two layers coated on a suitable substrate. One layer is ink receptive and the other wettable by fountain solution. At least one of the layers contains an absorber material either homogeneously mixed or heterogeneously dispersed therein. Intense near IR radiation from a focused laser causes ablation or loosening of the top layer. Debris left behind from incomplete ablation must be wiped or otherwise removed from the plate surface. For these applications a coating should be easily removable with modest laser exposure while unexposed areas must be tough enough to withstand normal press conditions. An improved ablation plate was disclosed in U.S. Ser. No. 08/614,437, now U.S. Pat. No. 5,605,780, that used a novel binder consisting of polymeric cyanoacrylate. No post treatment was necessary, however, removing the last traces of material can be difficult and exposure dependent. As a result background toning was sensitive to exposure conditions. Cyano containing polymers have also been recognized for their barrier properties in laser ablative imaging films as disclosed in U.S. Pat. No. 5,468,591, and as gas generating propellants in proofing systems as disclosed in U.S. Pat. No. 5,459,016, however, printing plate applications have special requirements and materials that work in one application do not necessarily work in others. Thus it does not follow that binder materials will work well in all three applications. To make an acceptable printing plate it is not sufficient that the transferred material be easily removed from the donor or that they are good propellants for other incorporated materials. Components, or their decomposition products, must have good adhesion to the receiver surface and good cohesive strength. Furthermore, transferred material must be relatively insoluble in press fluids such as ink and fountain solution and they must be abrasion insensitive for long run length.

Nitrocellulose, for example is a well known binder for ablation and material transfer applications it ablates well but does not hold up well to conventional printing press conditions when it has been transferred to a hydrophilic receiver such as anodized aluminum.

Material transfer methods for printing plate preparations are well known in the art, as disclosed for example in U.S. Pat. Nos. 3,945,318, and 3,964,389. In this method a donor sheet was placed in face-to-face contact with a receiver plate. The donor consisted of a coating on transparent Mylar® polyester film containing an absorber, such as carbon, an oleophilic material and a self oxidizing binder, such as nitrocellulose. In this disclosure, the hydrophilic receiver was a roughened anodized Al plate. A scanning focused laser was used to heat the donor imagewise. Intense rapid heating causes components of the donor film to be transferred to the receiver. Many other materials have been suggested for use as binders in transfer plate donors such as, phenol and cresol-formaldehyde resins (novalak resins), urea-formaldehyde, melamine-formaldehyde, alkyd resins, polyester resins, polyacrylate, polymethacrylate and polyethyacrylate, polyamindes (nylon), poly vinyl acetate, polyvinyl chloride, poly vinylidene chloride polystyrene, copolymers of styrene and butadiene, and poly alkylene-polyethylene as were disclosed in U.S. Pat. No. 3,962,513. Still others include methyl methacrylate, Butvar 76 (a reaction produce of poly (vinylalcohol and butyraldehyde)), alkyd resin, Cymel 301 (a melamine derivative), araldite 485-E50 (an epoxy resin), DeSoto 461-114 (a styrene-allyl alcohol copolymer) and novalac resin (cresol formaldehyde), as for example in U.S. Pat. No. 3,964,389; and vinylchloride and vinylacetate copolymer, Cymel (a UV crosslinkable polymer system), and hexamethoxymethylmelamine as disclosed in U.S. Pat. No. 4,626,493. Many of these binders, nitrocellulose for example, have been found to work quite poorly and must be supplemented with other transferable ink receptive components or layers to be useful on press. Under these extreme conditions some materials, will undergo reversible or irreversible decomposition. The prior art does not distinguish which among these many polymers produces plates with superior press characteristics.

SUMMARY OF THE INVENTION

A hydrophilic lithographic printing support such as aluminum or coated polyester is overlaid with a coated donor film. The donor film contains a transfer layer containing a material that absorbs laser radiation and a polymeric binder having recurring units of the following formula:

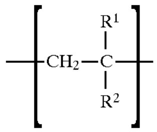

wherein:

$R^1$ represents cyano, isocyanate, azide, sulfonyl, nitro, phosphoric, phosphonyl, heteroaryl, or

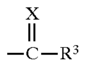

where

X is O, S, NR, or $N^+(R)_2$;

$R^3$ is R, OR, O—$M^+$, OCOOR, SR, NHCOR, NHCON$(R)_2$, $N(R)_2$ or $N^+(R)_3$;

$M^+$ is an alkali or ammonium moiety;

R is hydrogen, halogen, or an alkyl or cycloalkyl group; and $R^2$ is hydrogen, alkyl or from the same list as $R^1$;

and a receiver element consisting of a support having a hydrophilic surface such that upon imagewise heating the binder is transferred to the hydrophilic receiver surface.

The assemblage is imagewise exposed with a high intensity laser beam that transfers binder to the receiver to produce a lithographic printing plate. A negative working plate is produced wherein exposed regions of the receiver accept conventional printing inks while the unexposed regions are hydrophilic. The transfer requires relatively low exposure. No chemical or solution processing of the plate is required, and no post processing such as UV cure or heating is necessary.

Figure 1:
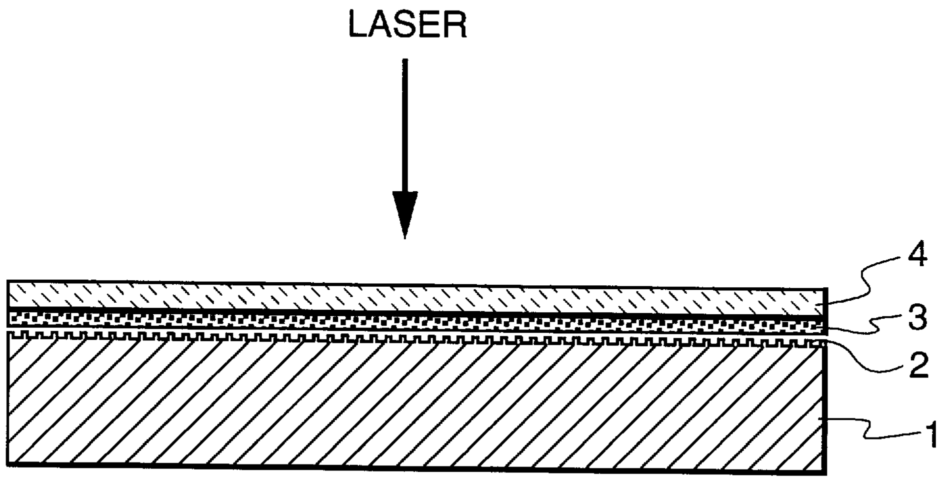
FIG. 1 is a diagram showing a cross section of a lithographic printing plate of the invention.

For a better understanding of the present invention, together with other and further objects, advantages and capabilities thereof, reference is made to the following detailed description and appended claims in connection with the preceding drawings and description of some aspects of the invention.

DETAILED DESCRIPTION OF THE PREFERRED EMBODIMENTS

A hydrophilic lithographic printing support such as aluminum or coated polyester is overlaid with a coated donor film. The donor film contains a transfer layer containing a material that absorbs laser radiation and a polymeric binder having recurring units of the following formula:

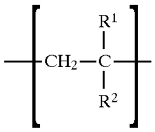

wherein:

R' represents cyano, isocyanate, azide, sulfonyl, nitro, phosphoric, phosphonyl, heteroaryl, or

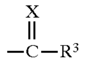

where

X is O, S, NR, or $N^+(R)_2$;

$R^3$ is R, OR, O—$M^+$, OCOOR, SR, NHCOR, NHCON$(R)_2$, $N(R)_2$ or $N^+(R)_3$;

$M^+$ is an alkali or ammonium moiety;

R is hydrogen, halogen, or an alkyl or cycloalkyl group; and $R^2$ is hydrogen, alkyl or from the same list as $R^1$;

and a receiver element consisting of a support having a hydrophilic surface such that upon imagewise heating the binder is transferred to the hydrophilic receiver surface.

The assemblage is imagewise exposed with a high intensity laser beam that transfers binder to the receiver to produce a lithographic printing plate. A negative working plate is produced wherein exposed regions of the receiver accept conventional printing inks while the unexposed regions are hydrophilic. The transfer requires relatively low exposure. No chemical or solution processing of the plate is required. And no post processing such as UV cure or heating is necessary.

Means for modulating a laser beam to record information on a substrate are well known in the art and need not be discussed here. In general they can be characterized as scanning mechanisms which cause the beam to traverse the area, delivering energy in a predetermined manner. Suitable apparatus is described in U.S. Pat. No. 3,739,088 issued Jun. 12, 1973.

In one embodiment the lithographic printing plate is made from a base receiver substrate consisting of a high electromotive metal such as aluminum. The surface of the aluminum is anodized and treated, as is well established in the prior art, with Na silicates or other compounds to make the surface hydrophilic.

The receiver substrate can be any self supporting material including, for example, metal, polymer film or paper.

In a preferred embodiment of this invention the receiver support is polyester (such as Estar™) overcoated with a hydrophilic layer such as a dispersion of $TiO_2$ in gelatin. The receiver plate surface is overlaid with a donor containing an oleophilic material, optionally a laser light absorber and a binder derived from the class of compounds having the combined properties of low ceiling or decomposition temperature (≦250° C.), good ink affinity, good binding of transferred material to receiver surface and high wear resistance on press. When exposed to a focused laser beam the coating is heated, causing transfer to the receiver surface. The receiver surface in the exposed regions is ink accepting. Unexposed regions remain clean and hydrophilic. When the exposed plate is used on a conventional lithographic offset printing press a superior print performance is obtained. Printed sheets roll up quickly and run lengths are long compared to previously disclose donor binders. No post processing, baking or UV/V is exposure is necessary.

FIG. 1 is a diagram showing a cross-section of one embodiment of this invention where a receiver support 1 with a rough hydrophilic surface 2. A layer 3 consisting of a laser light absorbing material and a binder consistent with the current invention on a transparent donor support 4.

The donor substrate can be any self supporting polymer film. Absorption strength in the transfer layer can be provided by, dyes, pigments, evaporated pigments, semiconductor material, metals, alloys of metals, metal oxides, metal sulfide or combinations of these materials. It is only necessary that the combination of laser intensity, exposure time and absorption strength sufficiently heat and thus transfer binder. In one preferred embodiment the absorber material is incorporated in the transfer layer itself. Absorber can be incorporated in a separate layer interposed between the transfer layer and the support, in the support or in any combination of layers. Adhesion promoting layers can be interposed between the top layer and the support, or between the top layer and an interposed layer or between the interposed layer and the support. A laser reflecting layer such as evaporated metal can be incorporated between the absorber layer and the transfer layer if the donor is exposed through a transparent support. A laser reflecting layer can be placed between the absorber layer and the donor support if the donor is exposed through a transparent receiver. An anti-reflection coating, as disclosed for example in U.S. Pat. No. 5,244,770, can be incorporated at the interface of the absorber layer on the irradiated side of the absorber layer. The layer or layers are coated on the donor support which is then placed in face-to-face contact with the hydrophilic receiver surface and mounted in an exposing apparatus. The exposure apparatus can be incorporated in a printing press to create the imaged plate on the impression cylinder(s) in color register or can be incorporated in a stand alone device. It is further recognized that the receiver plate or cylinder surface can be cleaned after press use with suitable solvents or by other means and the receiver reimaged with a fresh donor placed in face-to-face contact therewith.

Examples of vinyl polymers useful as the binder in the invention include the following repeat units:

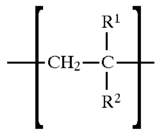

$R^1$ represents cyano, isocyanate, azide, sulfonyl, nitro, phosphoric, phosphonyl, heteroaryl, or

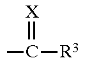

where

X is O, S, NR, or $N^+(R)_2$;

$R^3$ is R, OR, O—$M^+$, OCOOR, SR, NHCOR, NHCON$(R)_2$, $N(R)_2$ or $N^+(R)_3$;

$M^+$ is an alkali or ammonium moiety;

R is hydrogen, halogen, or an alkyl or cycloalkyl group; and $R^2$ is hydrogen, alkyl or from the same list as $R^1$, and a laser light absorber, is placed in face-to-face contact with a receiver sheet having a support with a hydrophilic surface. The assemblage is imagewise exposed with a high intensity laser beam that transfers the binder to the receiver to produce a lithographic printing plate. A negative working plate is produced wherein exposed regions of the receiver accept conventional printing inks while the unexposed regions are hydrophilic. The transfer requires relatively low exposure and no post processing is necessary. The improved formulation produces superior press performance having good press latitude, good ink receptivity, clean backgrounds and longer running plates than current thermal transfer plates.

Examples of useful polymers are shown in Table 1:

| Compound | $R^1$ | $R^2$ |
|---|---|---|
| 1 | —CN | —$COOCH_3$ |
| 2 | —CN | —$COOC_2H_5$ |
| 3 | —CN | —$COOC_3H_7$ |
| 4 | —CN | —$COOC_4H_9$ |
| 5 | —CN | —COOH |
| 6 | —CN | —CN |
| 7 | —CN | —$COOCH_2CH(CH_2CH_3)C_4H_9$ |
| 8 | —CN | —$COOCH_2CH_2OCH_3$ |
| 9 | —CN | —Cl |
| 10 | —CN | —$CONHCH_3$ |
| 11 | —CN | —$CON(CH_3)_2$ |
| 12 | —CN | $(—COOCH_3)_{70}(-COOC_2H_5)_{30}$ |
| 13 | —$COOCH_3$ | —$COOCH_3$ |
| 14 | —$CONHCH_3$ | —$CONHCH_3$ |
| 15 | —Cl | —$COOCH_3$ |

Examples of light absorbers useful in the current invention are as follows:

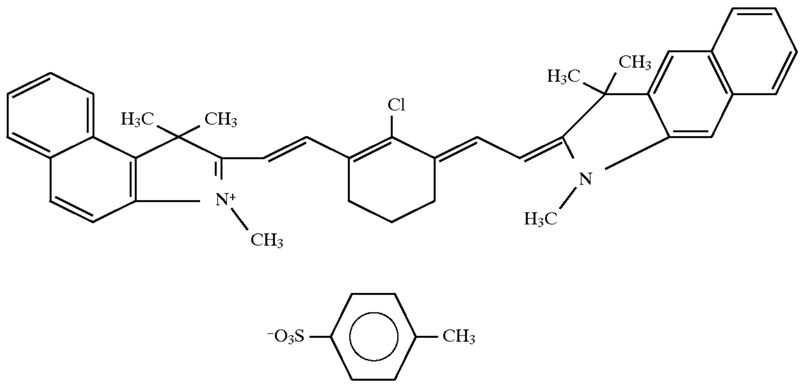

IR Dye 1

-continued

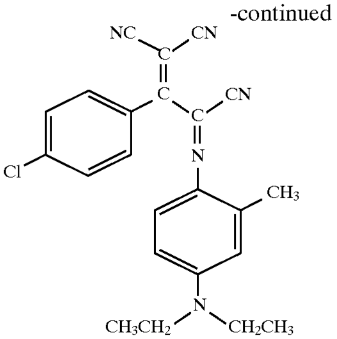

Cyan Dye-1

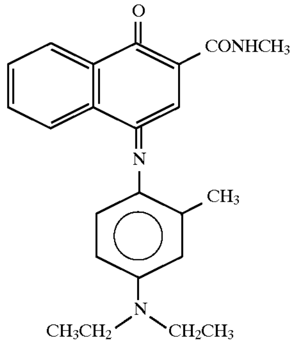

Cyan Dye-2

In the following examples experiments the donor/receiver pairs were exposed through the donor support. It is understood that, if the receiver sheet is transparent, the transfer can be achieved by exposing through the transparent receiver. It is further understood that a cushion layer composed of, a compliant polymer such as poly(ethylene), cellulose acetate propionate, cellulose acetate butyrate, y(vinyl acetate), poly(methyl acrylate), poly(methyl methacrylate), poly (styrene), or poly(vinyl butyral), for example, can be interposed between the donor layer and its support. It is recognized that a conformable cushion layer can minimize defects caused by dirt and dust by reducing the so called tent pole effect, where dirt particles induce an unwanted separation between the donor and receiver over an extended distance around the contaminant due to the beam strength of the support. In one preferred embodiment the compliant layer consists of a low Tg polymer such as polyethylene.

The invention is explained in detail on the basis of the following examples:

EXAMPLE 1

A commercial aluminum support (Eastman Kodak's 0.14 mm G-01, sodium silicate post treatment, oxide mass 2.5 g/$m^2$), was used as a receiver. A 0.1 mm polyester support was overcoated with 0.054 g/$m^2$ of IR absorbing dye (IR Dye-1 below) and 0.38 g/$m^2$ of polymethylcyanoacrylate, M.W. ~50K, from acetonitrile, with 0.004 g/$m^2$ of FC431 surfactant (for coating uniformity). The coated donor was placed face down on the aluminum receiver and imaged.

EXAMPLES 2–33

Examples 2 through 33 were prepared in exactly the same manner as Example 1 except for a substitution of the polymeric binder and coating solvent as listed in Table 2. (Note in Examples 28 and 29 the binder was eliminated altogether as indicated.

EXAMPLE 34

Example 34 was prepared as above and indicated in Table 2 but was coated on a production machine.

Examples were exposed using a lathe type writer with 450 mW per channel, 9 channels per revolution, a spot size of approximately 25 microns (1/$e^2$), 945 lines/cm (i.e. 2400 lines per inch), and up to 1100 revolutions per minute with a drum circumference of 53 cm.

All examples exhibited some material transfer under these conditions. With Example 1, for example, exposed areas on the receiver plate appeared as a light green against a neutral gray background. The nitrocellulose control, Example 5, exhibited a yellow image area against a neutral gray background. Plates were mounted on a conventional AB Dick offset press without processing, wiping or baking, and run using commercial fountain solution and ink. Press runs were evaluated for image uniformity, ink receptivity on rollup, wear characteristics and overall performance. The press results are summarized in Table 2. Selected polymer samples were also evaluated by thermal gravametric analysis. Polymer samples were placed on the weight pan and heated at the rate of 10° C. per minute in $N_2$. The temperature at which half the material is lost is reported in Table 2.

Cyanoacrylate polymers generally exhibited superior performance having uniform image transfer, good ink receptivity and resistance to wear. Good results were achieved with a variety of molecular weights. All other binder types suffered from problems. Nitrocellulose, for example is known to be an efficient binder for laser thermal applications but also decomposes readily. Transferred nitrocellulose and decomposed IR dye wore off the plate after only a few sheets. Plate performance was not seen to correlate with the temperature at which half the polymer weight is lost. Although polymers such as nitrocellulose and alpha methylpolystyrene are well known for their low ceiling and or decomposition temperatures and have good transfer characteristics these factors alone are not sufficient to produce good printing plates. Binders containing pendent cyano groups are reported to be good gas evolvers and have been disclosed as binders for transfer elements but this characterization is not sufficient to predict good transfer plates as evidenced by samples containing poly(methacrylonitrile) or styrene/ acrylonitrile copolymers. Members of the class of polymers encompassing the derivatives of cyanoacrylates give superior performance.

$g/m^2$. The example was exposed and transferred to a G01 A1 receiver. The image on the plate exhibited a pleasing cyan hue against the gray background. The receiver was mounted

TABLE 2

Coating Formulae, and Results for Polymeric Binder Series

| Code | Polymer | Polymer | Solvent[1] | Tga (c ½ loss) | Rollup[2] ink receptive | Run length[3] | Overall rating |
|---|---|---|---|---|---|---|---|
| 1 | Me—PCyA | poly(methylcyanoacrylate) [M.W.~50 k] | ACN | 197 | Start | >16,000 | Excellent |
| 2 | Me—PCyA | poly(methylcyanoacrylate) [M.W.~24 k] | ACN | | Start | >16,000 | Excellent |
| 26 | Me—PCyA | poly(methylcyanoacrylate) [M.W.~13 k] | ACN | | Start | >16,000 | Excellent |
| 27 | Me—PCyA | poly(methylcyanoacrylate) [M.W:~32 k] | ACN | | Start | >16,000 | Excellent |
| 3 | Me—Et—PCyA | (methylcyanoacrylate/ethylcyanoacrylate) copolymer | ACN | 230 | Start | >16,000 | Excellent |
| 34 | Me—Et—PCyA | (methylcyanoacrylate/ethylcyanoacrylate) copolymer | ACN:ACT 50:50 | | Start | >16,000 | Excellent |
| 4 | EtOX—Et—PCyA | poly(ethoxyethylcyanoacrylate) | ACN | | Slow | 8,000 | Good |
| 23 | MeOx—Et—PCyA | poly(methoxyethylcyanoacrylate) | ACN | | Slow | >16,000 | Good |
| 24 | N—Bu—PCyA | poly(n-butylcyanoacrylate) | ACN | | Start | 10,000 | Good |
| 25 | EE—PCyA | poly(ethoxyethylcyanoacrylate) | ACN | | Slow | 8,000 | Good |
| 15 | PMMA | poly(methyl methacrylate) | MEK | 349 | Uneven | >4,000 | Fair |
| 17 | PMAN | poly(methacrylonitrile) | MEK | | Start | 4,000 | Fair |
| 21 | Bu—Me—PCyA | poly(butylmethacrylatecyanoacrylate) | ACN | | Slow | 800 | Fair |
| 33 | PVCAN | poly(vinylchlorideacrylonitrile) | MEK | | Start | 3000 | Fair |
| 32 | SAN(30%) | (styrene/acrylonitrile) copolymer 30% acrylonitrile | MEK | | Uneven | 3000 | Fair |
| 31 | SAN(25%) | (styrene/acrylonitrile) copolymer 25% acrylonitrile | MEK | | Uneven | <3000 | Fair |
| 30 | SAN(20%) | (styrene/acrylonitrile) copolymer 20% acrylonitrile | MEK | | Uneven | <3000 | Fair |
| 22 | MeAc—PCyA | poly(methacrylicacidecyanoacrylate) | ACN | | Very Slow | 200 | Fair |
| 20 | a-STYRENE | poly(alpha methyl styrene) | MEK | 320 | Start | 20 | Fair |
| 10 | CA(acetyl = 39.8%) | cellulose acetate | ACT | 361 | Uneven | — | Bad |
| 11 | PDMS | poly(dimethylsiloxane) | DCM | | Uneven | — | Bad |
| 13 | Butvar(B76) | poly(vinyl butyral) 12% OH | MEK | 390 | Uneven | — | Bad |
| 5 | NC(1000–1500) | nitrocellulose | ACT | 197 | No | — | Bad |
| 6 | CAB | cellulose acetate buterate | ACT | 355 | No | — | Bad |
| 7 | PVAc#70 | poly(vinyl acetate) | MEK | 342 | No | — | Bad |
| 8 | PMA(40%) | poly(methyl acrylate) | MEK | | No | — | Bad |
| 9 | p-STYRENE | poly (styrene) | MEK | 372 | No | — | Bad |
| 12 | Butvar(B73) | poly(vinyl butyral) | MEK | | No | — | Bad |
| 14 | PVC(visc.1.26) | poly(vinyl chloride) | MEK | 304 | No | — | Bad |
| 16 | CAP20 | cellulose acetate propionate | ACT | 355 | No | — | Bad |
| 18 | XU218(Polyimide) | poly(imide) | NMP | 573 | No | — | Bad |
| 19 | LEXAN101 | poly(carbonate) | DCM | 524 | No | — | Bad |
| 28 | IR-1 | No Binder (IR dye only) | ACN | | No | — | Bad |
| 29 | IR-1 | No Binder (IR dye only) | DCM | | No | — | Bad |

1 ACN = acetonitrile plus acetone; ACT = acetone; MEK = methylethylketone; DCM = dichloromethane; NMP = 1-methyl-2-pyrrolidinone
2 Start = Ink receptive from the start, Slow = Many sheets needed to achieve good ink density, Uneven = Spotty image transfer, No = Not ink receptive
3 Estimated number of sheets before significant image wear.

EXAMPLE 35

Alternative Receiver

A Example donor was prepared as in Example 1, exposed and transferred to a receiver composed of chrome plated steel. The receiver was mounted on an AB Dick press and run as above. Good printing was achieved.

EXAMPLE 36

Alternative Receiver

A receiver was prepared by coating a dispersion of $TiO_2$, 3.11 $g/m^2$, and gelatin, 0.32 $g/m^2$, onto 4 mil polyester support. The donor from Example 34, as described above, was placed face-to-face with the receiver and exposed. The polyester receiver plate was then mounted on the AB Dick press and run as above. Good uniform transfers were achieved. The image areas received ink readily and the plates exhibited no background toning.

EXAMPLE 37

Visual Contrast Enhancement with Image Dye

A donor was prepared as in Example 1 except that a cyan dye-1 was added to the coating solution at the level of 0.043 $g/m^2$. The example was exposed and transferred to a G01 A1 receiver. The image on the plate exhibited a pleasing cyan hue against the gray background. The receiver was mounted on an AB Dick press and run as above. Good long running printing was achieved.

EXAMPLE 38

Visual Contrast Enhancement with Image Dye

A donor was prepared as in Example 1 except that a cyan dye-2 was added to the coating solution at the level of 0.043 $g/m^2$. The example was exposed and transferred to a G01 A1 receiver. The image on the plate exhibited a pleasing cyan hue against the gray background. The receiver was mounted on an AB Dick press and run as above. Good long running printing was achieved.

EXAMPLE 39

Visual Contrast Enhancement with Image Pigment

A donor was prepared as in Example 1 except that a cyan pigment, Cu-Pthalocyanine, was added to the coating solution at the level of 0.043 $g/m^2$. The example was exposed and transferred to a G01 A1 receiver. The image on the plate exhibited a pleasing cyan hue against the gray background. The receiver was mounted on an AB Dick press and run as above. Good long running printing was achieved.

EXAMPLE 40

Alternative Laser Absorber with IR Dye

A donor was prepared as in Example 1 except that Cyasorb IR-165 (available from American Cyanamid) was added to the coating solution at the level of 0.16 $g/m^2$. The example was written with a $Nd^{++}YAG$ at 1064 nm and transferred to G01 A1. The receiver was mounted on an AB Dick press and run as above. Good long running printing was achieved.

EXAMPLE 41

Cushion Layer

A donor was prepared by first coating the polyester support with poly(vinyl butyral) at the level 8.64 $g/m^2$. It was then overcoated as in Example 1. The example was exposed and transferred to a G01 A1 receiver. The receiver was mounted on an AB Dick press and run as above. Good printing was achieved.

EXAMPLE 42

Alternative Cushion Layer

A donor was prepared by coating a polyester support having a coextruded layer of polyethylene with an overcoated as in Example 1. The example was exposed and transferred to a G01 A1 receiver. The receiver was mounted on an AB Dick press and run as above. Good printing was achieved.

EXAMPLE 43

Optional Heating Step

Two donor were prepared as in Example 36. The examples was exposed and transferred to receiver as described in Example 38. One example was heated after imaging by running it through a laminator set to 120° C. The receivers were mounted on an AB Dick press and run as above. The heated example exhibited longer run length than the unheated example.

It is seen from the above that this invention allows a lithographic printing plate to be made directly from digital data without the need for intermediate films and conventional time-consuming optical printing methods. It requires relatively low exposures compared to other laser plate making processes. It is well suited for exposure with relatively inexpensive and highly reliable diode lasers. In addition the printing plate requires no post processing thereby saving time, and eliminating the expense, maintenance, and floor space of a plate processor. This material transfer plate has superior performance to plates made from other materials known in the art. Plates consistent with this invention roll up quickly, show good ink discrimination, do not scum, do not blind and have superior wear resistance for long runs. Post exposure baking or UV/VIS exposure is not required.

Although this inventive process has been described in connection with specific forms and embodiments thereof, it will be appreciated that various modifications other than those discussed above may be resorted to without departing from the spirit or scope of the invention. For example, equivalent process steps may be substituted for those specifically shown and described, certain combinations of method steps may be used independently of other method steps, and in certain cases, particular sequences of steps may be reversed or interposed, all without departing from the spirit or scope of the invention as defined in the appended claims.

We claim:

1. An assemblage for forming a lithographic printing plate, said assemblage comprising:

a donor support having thereon a layer or layers, wherein at least one of said layers comprises a vinyl polymeric binder having recurring units of the following formula:

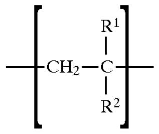

wherein:

$R^1$ is cyano, and $R^2$ is —CO—$R^3$, where $R^3$ is OR, and R is alkyl or alkoxyalkyl; and a receiver element comprising a receiver support having a hydrophilic surface such that, upon imagewise heating, said binder is transferred to said hydrophilic receiver surface.

2. The assemblage of claim 1 wherein a laser absorbent material is incorporated in the layer that comprises the vinyl polymeric binder.

3. The assemblage of claim 1 wherein a laser absorbent material is incorporated in a separate layer interposed between the donor support and a transfer layer that comprises the vinyl polymeric binder.

4. The assemblage of claim 1 wherein said vinyl polymeric binder is a poly(alkyl cyanoacrylate).

5. The assemblage of claim 4 wherein said poly(alkyl cyanoacrylate) is poly(methyl 2-cyanoacrylate) or (methylcyanoacrylate/ethylcyanoacrylate) copolymer.

6. The assemblage of claim 1 wherein said laser absorbent material is a pigment.

7. The assemblage of claim 1 wherein said laser absorbent material is a dye.

8. The assemblage of claim 1 wherein said receiver support is metal.

9. The assemblage of claim 1 wherein said receiver support is roughened anodized aluminum.

10. The assemblage of claim 1 wherein said receiver support is chrome plated steel.

11. The assemblage of claim 1 wherein said receiver support is a self supporting polymer film.

12. The assemblage of claim 11 wherein said polymer film is polyester.

13. The assemblage of claim 1 wherein the surface of said receiver support contains a mixture of titanium dioxide and gelatin.

14. The assemblage of claim 1 wherein said vinyl polymeric binder is selected from the group consisting of poly (methyl cyanoacrylate), (methylcyanoacrylate/ethylcyanoacrylate) copolymer, poly(ethoxyethyl cyanoacrylate), poly(methoxyethyl cyanoacrylate), poly (ethyl 2-cyanoacrylate), poly(propyl 2-cyanoacrylate), and poly(n-butyl cyanoacrylate).

15. An assemblage for forming a lithographic printing plate, said assemblage comprising:

a receiver support comprising a rough hydrophilic surface such that, upon imagewise heating, a binder is transferred to said hydrophilic receiver surface;

a donor support having thereon a layer or layers, wherein at least on one of said layer or layers comprises a laser light absorbing material and at least one of said layer or layers comprises the binder;

wherein, the binder comprises a poly(alkyl cyanoacrylate) or a poly(alkoxyalkyl cyanoacrylate).

16. The assemblage of claim 15 wherein said poly(alkyl cyanoacrylate) or poly(alkoxyalkyl cyanoacrylate) is selected from the group consisting of poly(methyl cyanoacrylate), (methylcyanoacrylate/ethylcyanoacrylate) copolymer, poly(ethoxyethyl cyanoacrylate), poly (methoxyethyl cyanoacrylate), poly(ethyl 2-cyanoacrylate), poly(propyl 2-cyanoacrylate), and poly(n-butyl cyanoacrylate).

17. The assemblage of claim 15 wherein the laser absorbent material is incorporated in the layer that comprises the binder.

18. The assemblage of claim 15 wherein the laser absorbent material is incorporated in a separate layer interposed between the donor support and the layer that comprises the binder.

19. The assemblage of claim 15 wherein the receiver support is roughened anodized aluminum.

20. The assemblage of claim 15 wherein said donor support is transparent.

21. The assemblage of claim 15 additionally comprising a cushion layer interposed between said layer comprising said binder and said donor support.

22. The assemblage of claim 21 wherein said cushion layer comprises a polymer selected from the group consisting of poly(ethylene), cellulose acetate propionate, cellulose acetate butyrate, poly(vinyl acetate), poly(methyl acrylate), poly(methyl methacrylate), poly(styrene), and poly(vinyl butyral).

23. The assemblage of claim 21 wherein said poly(alkyl cyanoacrylate) or poly(alkoxyalkyl cyanoacrylate) is selected from the group consisting of poly(methyl cyanoacrylate), (methylcyanoacrylate/ethylcyanoacrylate) copolymer, poly(ethoxyethyl cyanoacrylate), poly (methoxyethyl cyanoacrylate), poly(ethyl 2-cyanoacrylate), poly(propyl 2-cyanoacrylate), and poly(n-butyl cyanoacrylate).

24. The assemblage of claim 23 wherein said poly(alkyl cyanoacrylate) is selected from the group consisting of poly(methyl cyanoacrylate) and (methylcyanoacrylate/ethylcyanoacrylate) copolymer.

25. The assemblage of claim 15 wherein said poly(alkyl cyanoacrylate) is selected from the group consisting of poly(methyl cyanoacrylate) and (methylcyanoacrylate/ethylcyanoacrylate) copolymer.

* * * * *